(12) United States Patent
Andreev et al.

(10) Patent No.: US 7,882,406 B2
(45) Date of Patent: Feb. 1, 2011

(54) BUILT IN TEST CONTROLLER WITH A DOWNLOADABLE TESTING PROGRAM

(75) Inventors: Alexander E. Andreev, San Jose, CA (US); Anatoli A. Bolotov, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 343 days.

(21) Appl. No.: 12/118,477

(22) Filed: May 9, 2008

(65) Prior Publication Data

US 2009/0282303 A1 Nov. 12, 2009

(51) Int. Cl.
*G11C 29/00* (2006.01)
(52) U.S. Cl. .............................. 714/718; 714/5; 714/25; 714/30; 714/31; 714/42; 714/733; 714/734; 714/742; 714/799; 716/12; 365/185.01; 365/201
(58) Field of Classification Search ........................ None
See application file for complete search history.

(56) References Cited

U.S. PATENT DOCUMENTS

| | | | | |
|---|---|---|---|---|
| 4,517,512 | A | 5/1985 | Petrich et al. ............. 324/73 R |
| 4,929,889 | A | 5/1990 | Seiler et al. ................ 371/22.3 |
| 5,051,997 | A * | 9/1991 | Sakashita et al. ............ 714/732 |
| 5,617,531 | A | 4/1997 | Crouch et al. .................. 714/30 |
| 5,742,557 | A | 4/1998 | Gibbins et al. ......... 365/230.05 |
| 5,896,330 | A | 4/1999 | Gibson ........................ 365/201 |
| 5,961,653 | A | 10/1999 | Kalter et al. ................... 714/30 |
| 6,014,336 | A * | 1/2000 | Powell et al. ................ 365/201 |
| 6,070,256 | A | 5/2000 | Wu et al. ...................... 714/718 |
| 6,085,334 | A | 7/2000 | Giles et al. .................... 714/30 |
| 6,288,969 | B1 | 9/2001 | Gibbins et al. ......... 365/230.05 |
| 6,347,056 | B1 | 2/2002 | Ledford et al. .............. 365/201 |
| 6,353,563 | B1 | 3/2002 | Hii et al. ........................ 714/30 |
| 6,553,526 | B1 | 4/2003 | Shephard, III ............... 714/33 |
| 6,634,003 | B1 | 10/2003 | Phan ........................... 714/710 |
| 6,681,358 | B1 | 1/2004 | Karimi et al. ............... 714/733 |
| 6,941,494 | B1 | 9/2005 | Andreev et al. ............. 714/718 |
| 7,010,736 | B1 | 3/2006 | Teh et al. ..................... 714/733 |
| 7,028,240 | B1 * | 4/2006 | Bautista et al. ............. 714/733 |
| 7,062,694 | B2 * | 6/2006 | Caty et al. ................... 714/733 |
| 7,096,386 | B2 | 8/2006 | Ozawa ......................... 714/30 |
| 7,139,204 | B1 | 11/2006 | Behera ........................ 365/201 |
| 7,260,759 | B1 | 8/2007 | Zarrineh et al. ............... 714/30 |
| 7,653,854 | B2 | 1/2010 | Anzou et al. ................ 714/733 |
| 7,773,439 | B2 | 8/2010 | Do et al. ...................... 365/201 |
| 2002/0059543 | A1 | 5/2002 | Cheng et al. .................. 714/30 |
| 2002/0104051 | A1* | 8/2002 | Gupta ......................... 714/733 |
| 2002/0129298 | A1 | 9/2002 | Tamura ........................ 714/30 |
| 2002/0174394 | A1 | 11/2002 | Ledford et al. .............. 714/733 |
| 2002/0178416 | A1 | 11/2002 | Chen et al. .................... 714/30 |
| 2002/0188902 | A1 | 12/2002 | Fan et al. ..................... 714/724 |
| 2002/0194545 | A1 | 12/2002 | Abbott ......................... 714/42 |
| 2003/0023914 | A1 | 1/2003 | Taylor et al. ................. 714/733 |
| 2004/0181303 | A1 | 9/2004 | Walmsley ................... 700/115 |
| 2005/0015671 | A1 | 1/2005 | Parulkar et al. ............... 714/30 |
| 2005/0028058 | A1* | 2/2005 | Perner ......................... 714/718 |

(Continued)

*Primary Examiner*—John P Trimmings
(74) *Attorney, Agent, or Firm*—Christopher P. Maiorana, PC

(57) ABSTRACT

An apparatus comprising a processor and an internal memory. The processor may be configured to test an external memory using (i) a netlist and (ii) a testing program. The internal memory may be configured to store the testing program. The testing program may be downloadable to the internal memory independently from the storing of the netlist.

20 Claims, 8 Drawing Sheets

U.S. PATENT DOCUMENTS

| | | |
|---|---|---|
| 2005/0138514 A1* | 6/2005 | Burdine et al. .............. 714/733 |
| 2005/0246602 A1* | 11/2005 | Bahl et al. ................. 714/733 |
| 2005/0262401 A1 | 11/2005 | Saitou ......................... 714/42 |
| 2005/0268159 A1 | 12/2005 | Tzeng ........................... 714/5 |
| 2006/0156134 A1 | 7/2006 | Mukherjee et al. .......... 714/733 |
| 2006/0212765 A1 | 9/2006 | Haufe ........................ 714/724 |
| 2006/0242521 A1* | 10/2006 | Hii et al. .................... 714/733 |
| 2007/0220389 A1* | 9/2007 | Sato ........................... 714/733 |
| 2008/0077834 A1 | 3/2008 | Khoche et al. .............. 714/732 |
| 2008/0282119 A1* | 11/2008 | Suzuki et al. ............... 714/718 |
| 2009/0133003 A1 | 5/2009 | Andreev et al. ............. 717/139 |

\* cited by examiner

BUILT IN TEST CONTROLLER WITH A DOWNLOADABLE TESTING PROGRAM

FIELD OF THE INVENTION

The present invention relates to memory testing generally and, more particularly, to a method and/or apparatus for implementing a built in test controller having a downloadable testing program.

BACKGROUND OF THE INVENTION

In the synthesis of VLSI designs, built-in test controllers are often implemented. Some modules (such as memories) have a much higher defect density than other types of logic. Memories normally implement additional and comprehensive testing. One conventional approach is to test such memory modules by using a test controller placed on a chip. Comprehensive testing often means performing a number of tests. Such tests often become cumbersome to combine into one test controller.

It would be desirable to implement a test controller that may receive downloadable tests. The downloadable tests may be implemented in the form of a program that may be downloaded into the test controller and executed during the test runtime.

SUMMARY OF THE INVENTION

The present invention concerns an apparatus comprising a processor and an internal memory. The processor may be configured to test an external memory using (i) a netlist and (ii) a testing program. The internal memory may be configured to store the testing program. The testing program may be downloadable to the internal memory independently from the storing of the netlist.

The objects, features and advantages of the present invention include providing a test controller that may (i) receive downloadable programming, (ii) download a precompiled test program up to the capacity of an internal memory, (iii) provide a programmable test program that may be written/rewritten, (iv) provide a flexible test program that may be changed on the fly during testing, (v) provide a low complexity implementation that uses a minimal amount of logic around an internal memory, and/or (vi) provide a universal implementation of a microprocessor and internal memory that remains consistent for different types of test controllers.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
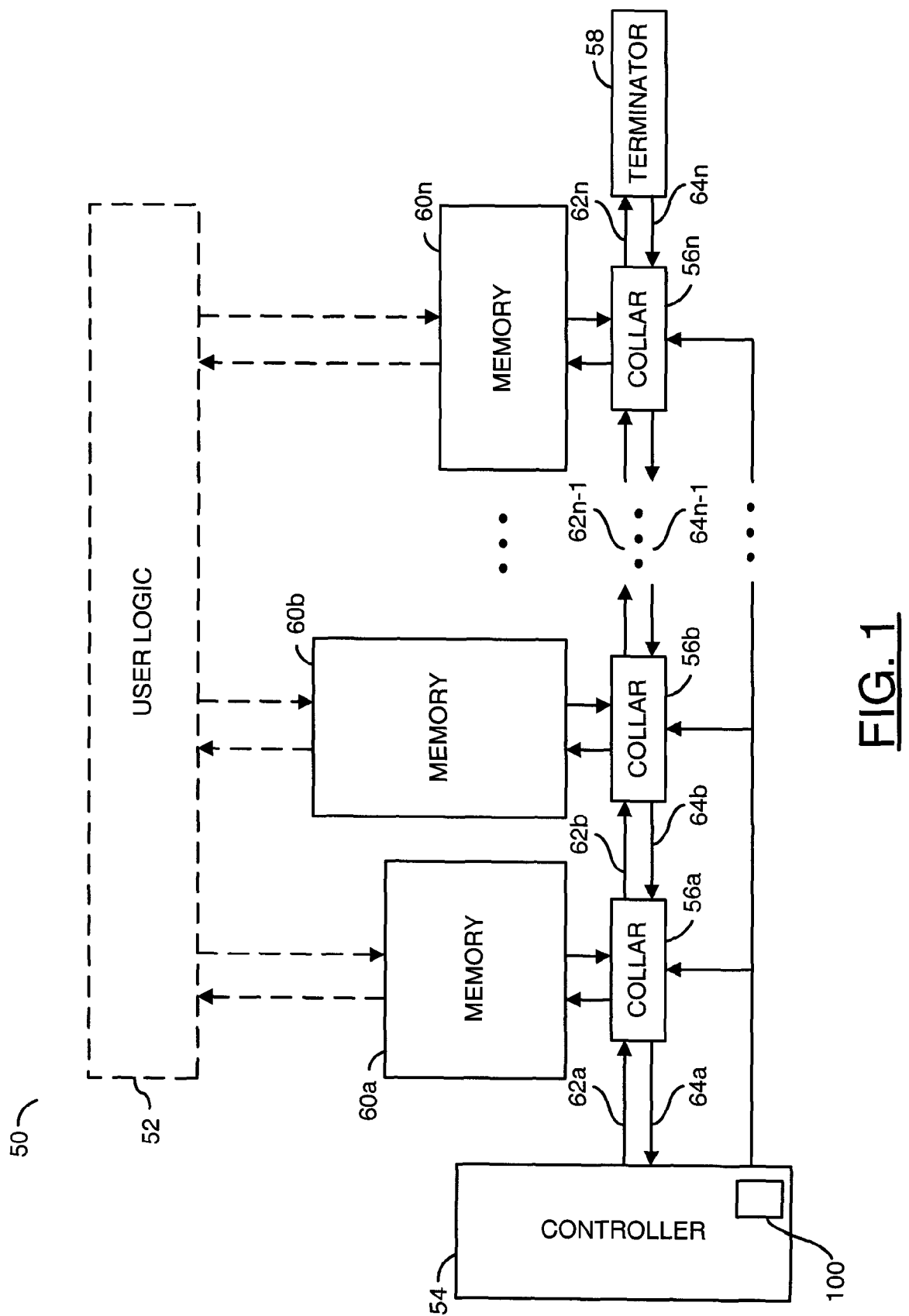
FIG. 1 is a diagram illustrating a context of the present invention.

Referring to FIG. 1, a block diagram of a system 50 is shown in accordance with a preferred embodiment of the present invention. The system 50 generally comprises a block (or circuit) 52, a block (or circuit) 54, a number of memory circuits 60a-60n, a number of blocks 56a-56n and a block (or circuit) 58. In one example, the circuit 52 may be implemented as a user logic circuit. The circuit 54 may be implemented as a controller circuit. In one example, the controller circuit 54 may be implemented as a BIST circuit. The controller circuit 54 may be a common controller used with each of the memory circuits 60a-60n. The controller circuit 54 may include a circuit 100. The circuit 100 may be implemented as a core testing module. The circuits 60a-60n may be implemented as memory circuits. The circuits 56a-56n may be implemented as collar circuits. The circuit 58 may be implemented as a terminator unit.

The system 50 may be implemented as part of the transport subsystem of a MBIST chain architecture. For example, the memory circuits 60a-60n may form a chain. A number of busses 62a-62n and 64a-64n may be implemented. The busses 62a-62n and 64a-64n may be implemented having moderate width (e.g., 8-10 bits). However, other bit-widths may also be implemented. The busses 62a-62n and 64a-64n may be connected to form a chain. The controller 54 may be on one side of the chain. The terminator unit 58 may be on another side of the chain. collar circuits 56a-56n may be implemented to allow the various memory circuits 60a-60n to operate with the common controller 54. For example, the collar 56a may operate with the memory 60a, the collar 56b may operate with the memory circuit 60b, etc. The structures and/or size of the memory circuits 60a-60n may be varied to meet the design criteria of a particular implementation. For example, the memory circuits may be implemented as a SRAM memory, a 1-port memory, a 2-port memory, or other types and/or combinations of memory. The length of particular busses 62a-62n and 64a-64n connecting the neighboring collars 56a-56n (or to the controller 54 and the nearest one of the collars 56a-56n) is not normally a critical parameter and may be varied. An MBIST chain architecture normally permits splitting long connections into smaller pieces by adding flipflop boundaries between such connections.

Figure 2:
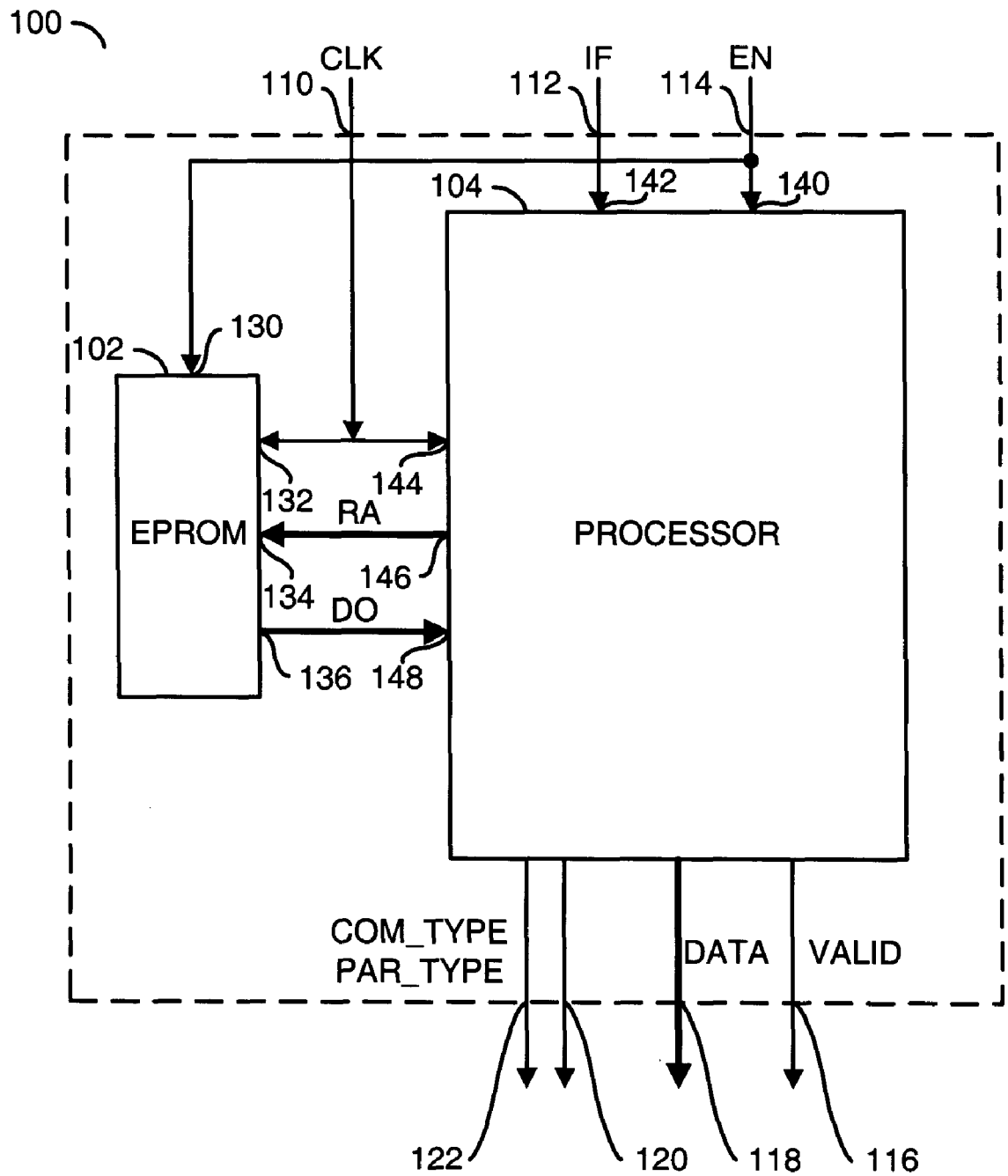
FIG. 2 is a diagram of a test controller.

Referring to FIG. 2, a block diagram of a system 100 is shown in accordance with a preferred embodiment of the present invention. The system 100 may be implemented as a Built-In Test Controller. The system 100 may provide a Built-In Test Controller that includes a downloadable testing program.

The system 100 may provide a precompilation of a test program into a binary file. One or more test programs may be implemented. The test program may be downloaded to a read-only memory 102. The program may be executed during test runtime. The system 100 may allow a test controller netlist to remain unchanged while changing (or modifying) test programs. Such changes may provide flexibility. Such testing may be done on the fly (e.g., during a testing phase in a factory). The system 100 may be implemented independently of a particular test under development. The system 100 may provide a consistent controller core that may be used along with various built-in test controllers. In one example, the system 100 may be used for testing memory modules. However, the system 100 may be designed to test other types of circuit designs.

The test controller of the system 100 may allow (i) improved timing, (ii) reduced die size, (iii) at speed testing on a chip, (iv) testing multiple instances, (v) easy implementation and easy extension to desired built-in test, (vi) downloadable and/or downloaded precompiled test program(s) up to the capacity of an internal memory, (vii) a programmable test program that may be written/rewritten, (viii) a flexible test program that may be changed on the fly, (ix) a low complexity implementation that uses a minimal amount of logic around an internal memory, and/or (x) a highly universal design with a microprocessor and internal memory that remain consistent for different types of test controllers.

The system 100 generally comprises a block (or circuit) 102 and a block (or circuit) 104. The circuit 102 may be implemented as an electrically programmable read only memory module (EPROM) (or circuit). Other nonvolatile memories (e.g., EEPROM, flash memory, etc.) may also be implemented. The circuit 104 may be implemented as a processor module (or circuit). The system 100 may be used to test an external memory or other design (e.g., the memory devices 60a-60n). The system 100 may have an input 110 that may receive a signal (e.g., CLK), an input 112 that may receive a signal (e.g., IF), an input 114 that may receive a signal (e.g., EN), an output 116 that may present a signal (e.g., VALID), an output 118 that may present a signal (e.g., DATA), an output 120 that may present a signal (e.g., COM_TYPE), and an output 122 that may present a signal (e.g., PAR_TYPE).

The circuit 102 may have an input 130 that may receive the signal EN, an input 132 that may receive the signal CLK, an input 134 that may receive a signal (e.g., RA), and an output 136 that may present a signal (e.g., DO). The processor module 104 may have an input 140 that may receive a signal EN, an input 142 that may receive a signal IF, an input 144 that may receive the signal CLK, an output 146 that may present the signal RA, and an input 148 that may receive the signal DO. The system 100 may include a program stored in the EPROM module 102. The processor module 104 may read the program stored in the EPROM module 102 and interpret commands received from the program.

The signal EN may be implemented as an enable signal. The signal IF may be implemented as an interface signal. The signal CLK may be implemented as a clock signal that oscillates at a particular frequency. The signal RA may be implemented as a read address signal. The signal DO may be implemented as a data output signal.

Figure 3:
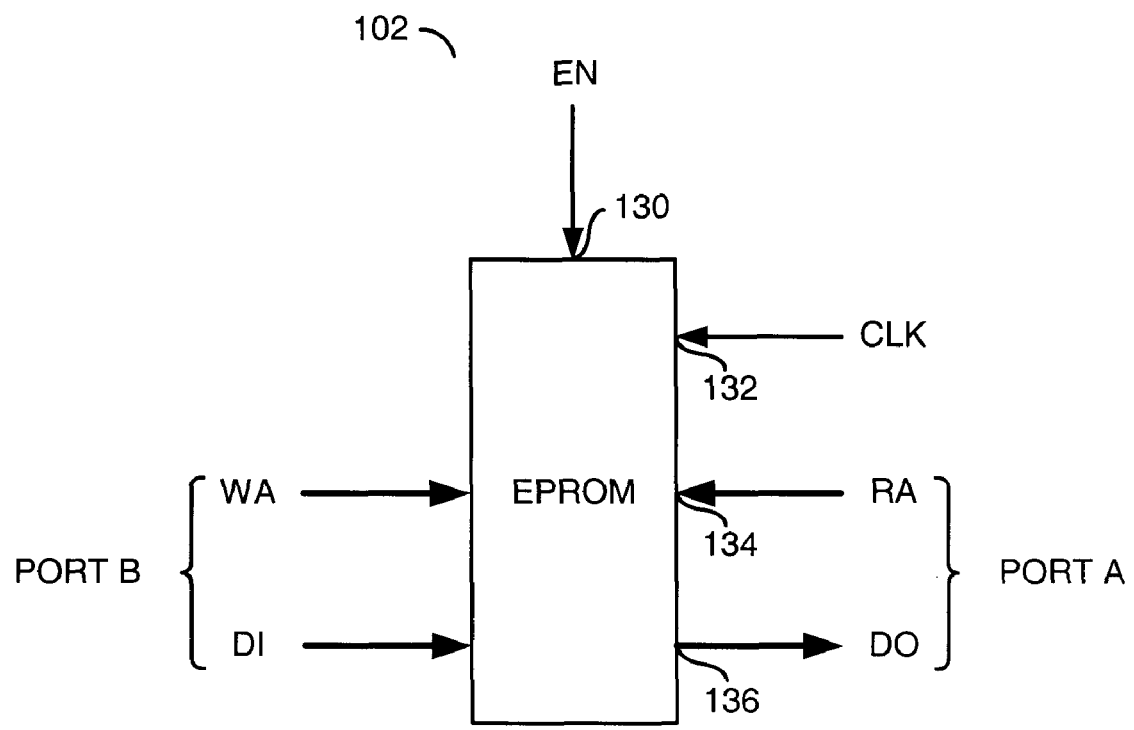
FIG. 3 is a diagram of a memory.

Referring to FIG. 3, a more detailed diagram of the circuit 102 is shown. In one example, the circuit 102 may be implemented as a programmable read-only memory (or ROM). However, other types of non-volatile memory circuits may be used to meet the design criteria of a particular implementation. For example, the memory 102 may be implemented as a binary table that may be hardwired as part of the controller 100. The memory circuit 102 may be implemented as a type of memory appropriate for use in cell-based chip designs for data storing along with the data read-only operation.

In general, during each cycle of the signal CLK, the memory circuit 102 may be in an active (e.g., enabled, or "1") or an inactive (e.g., disabled, or "0") state depending on the signal EN. For example, when the signal EN=1, data stored at a location in the memory 102 specified by the read address signal RA may be presented through the output 136 as the memory data-output signal DO.

The memory circuit 102 may be used to store system-level programs. The memory circuit 102 may be configured to download and change programs on the fly. In one example, the memory circuit 102 may be implemented as a two port (or dual port) memory. One port (e.g., a port A) may be used for reading. Another port (e.g., a port B) may be used for writing (e.g., downloading) data. A two port implementation may be useful for built-in testing chip purposes.

Figure 4:
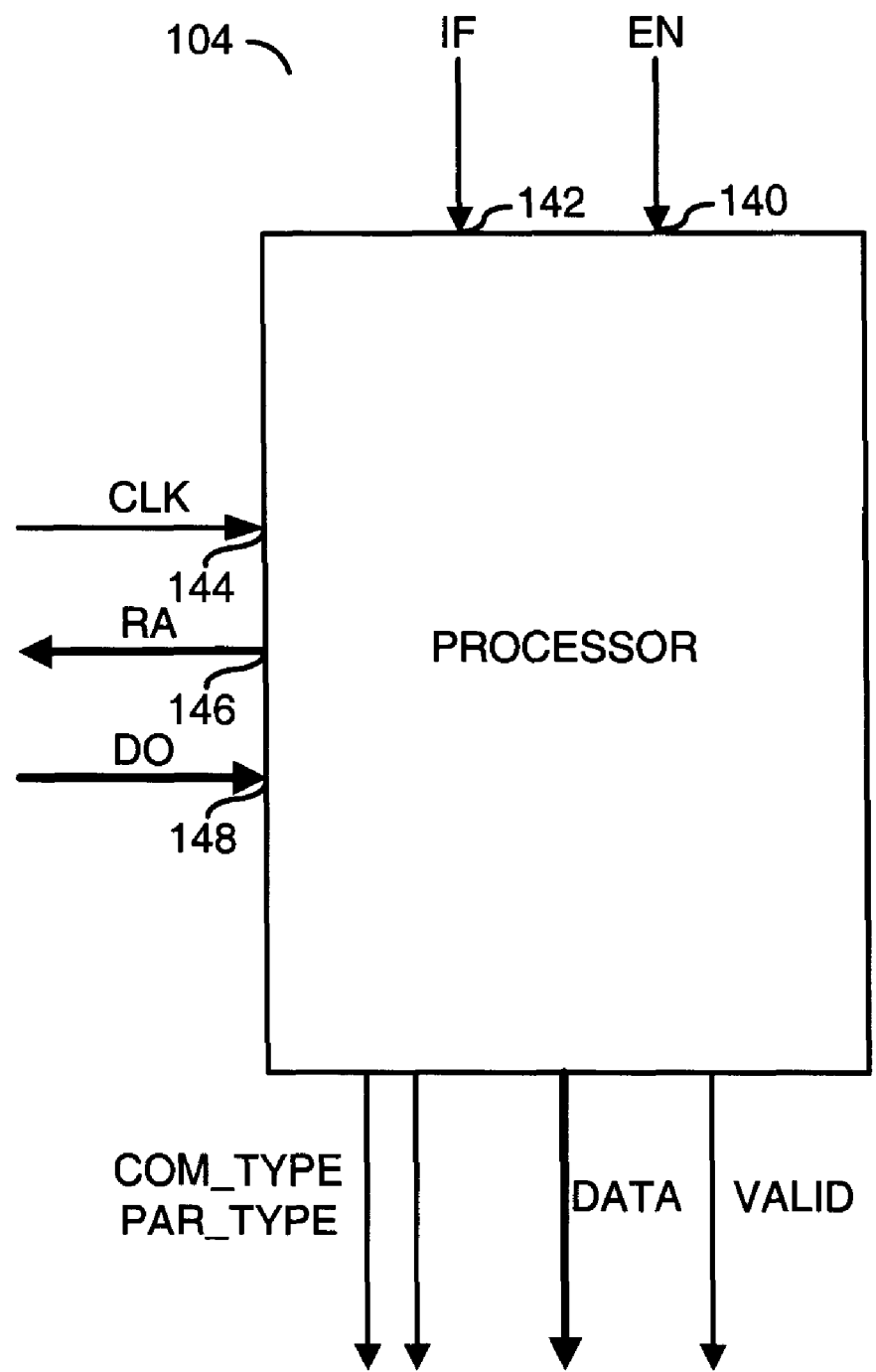
FIG. 4 is a diagram of a microprocessor.

Referring to FIG. 4, a diagram of the processor circuit 104 is shown. The processor circuit 104 may be implemented as a built-in microprocessor. For example, the circuit 104 may be built into a memory test system. The microprocessor 104 may be configured to read a sequence of data stored in the memory 102. The data may be read, in one example, one item at a time.

Figure 5:
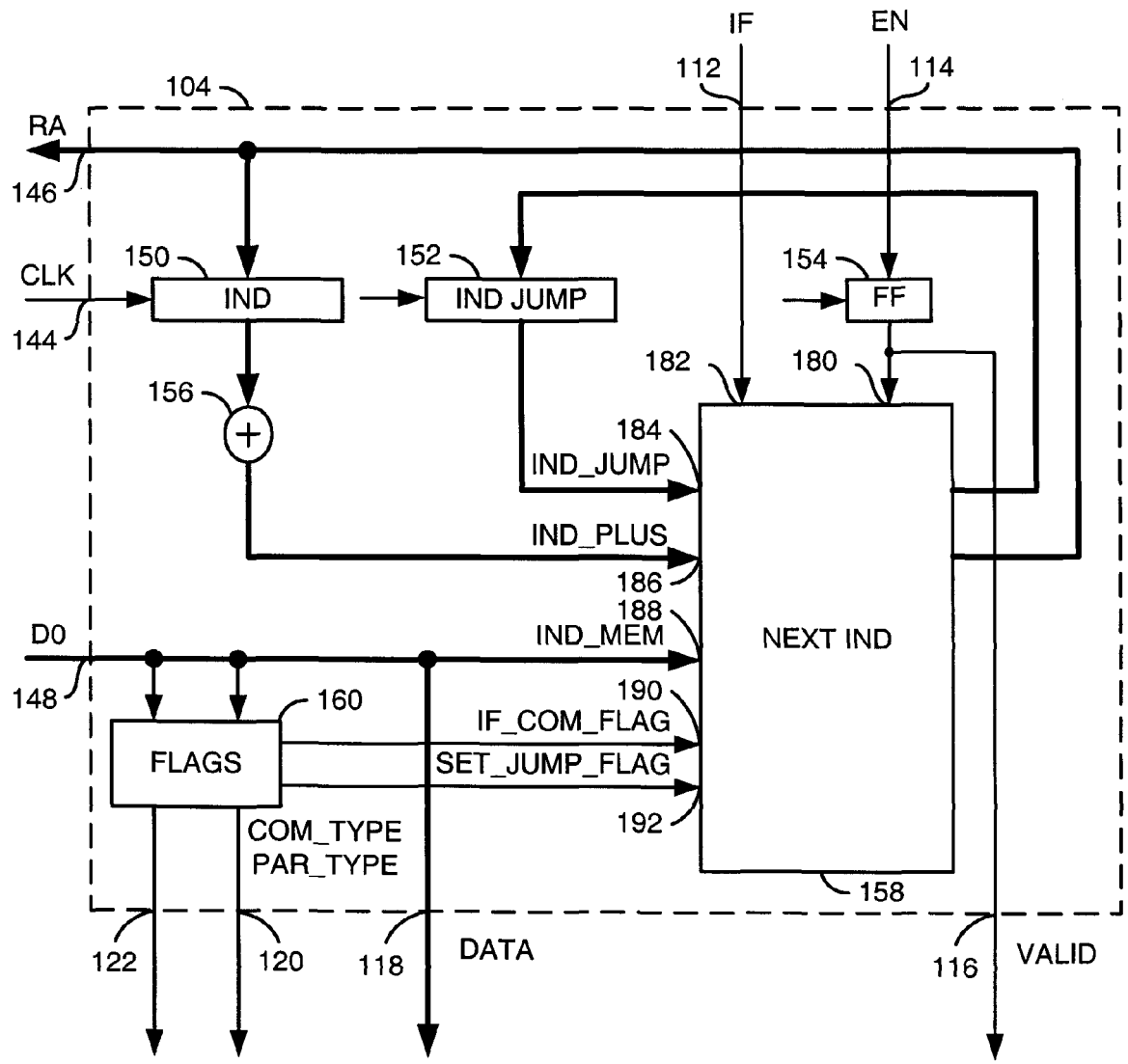
FIG. 5 is a more detailed diagram of the microprocessor of FIG. 4.

Referring to FIG. 5, a more detailed diagram of the microprocessor circuit 104 is shown. The circuit 104 generally comprises a circuit 150, a circuit 152, a circuit 154, a circuit 156, a circuit 158, and a circuit 160. The circuits 150, 152 and 154 may be implemented as flip-flops. The circuit 156 may be implemented as an adder circuit. The circuit 158 may be implemented as a NEXT IND circuit. The circuit 160 may be implemented as a flag circuit.

The circuit 156 may generate a signal (e.g., IND_PLUS). The circuit 152 may generate a signal (e.g., IND_JUMP). The circuit 154 may generate a signal (e.g., VALID). The flip-flops 150, 152 and 154 may store and retrieve current values of IND, IND_JUMP and EN. The flip-flops 150, 152 and 154 may also provide a one (or more) clock cycle delay to the value of the read address signal RA, the value of the signal IND JUMP, and the value of the enable input signal EN.

The circuit 158 may have an input 180 that may receive the signal VALID, an input 182 that may receive the signal IF, an input 184 that may receive the signal IND_JUMP, an input 186 that may receive the signal IND_PLUS, an input 188 that may receive a signal (e.g., IND_MEM), an input 190 that may receive a signal (e.g., IF_COM_FLAG), and an input 192 that may receive a signal (e.g., SET_JUMP_FLAG). The signal IF_COM_FLAG and the signal SET_JUMP_FLAG may be implemented as auxiliary flags.

The signal DO may be stored in the memory 102. The signal DO may have a specific format that may be used for testing. The width of the memory 102 may be varied. For example, if a value IND WIDTH denotes the width of the memory address signal RA, then the capacity of the memory 102 may be defined by the following equation:

$$\text{Capacity} = 2_{IND\_WIDTH},$$

where the signal DO is 2-bits wider than the memory address signal RA. If the first two most significant bits are denoted as a prefix bit (e.g., $PREF_0$) and a prefix bit (e.g., $PREF_1$), then the signal DO may be defined as follows:

$$DO = (PREF_0, PREF_1, DATA),$$

where DATA is a binary word having a width defined as IND WIDTH bits. In one example, the data signal DO may be implemented as a microprocessor command and two prefix bits. The prefix bits $PREF_0$ and $PREF_1$, may be implemented to code the microprocessor command as one of the following types:

1. unconditional command—if $PREF_0=0$ and $PREF_1=0$;
2. conditional command—if $PREF_0=0$ and $PREF_1=1$; in this case the auxiliary flag IF_COM_FLAG is set to 1;
3. SET_JUMP command—if $PREF_0=1$ and $PREF_1=0$; in this case the auxiliary flag SET_JUMP_FLAG is set to 1.

Depending on the maximum test program size that may be downloaded into the memory 102, the size of the memory 102 may be varied in typical cases as follows:

$$\text{Capacity} = 16 \div 128.$$

Figure 6:
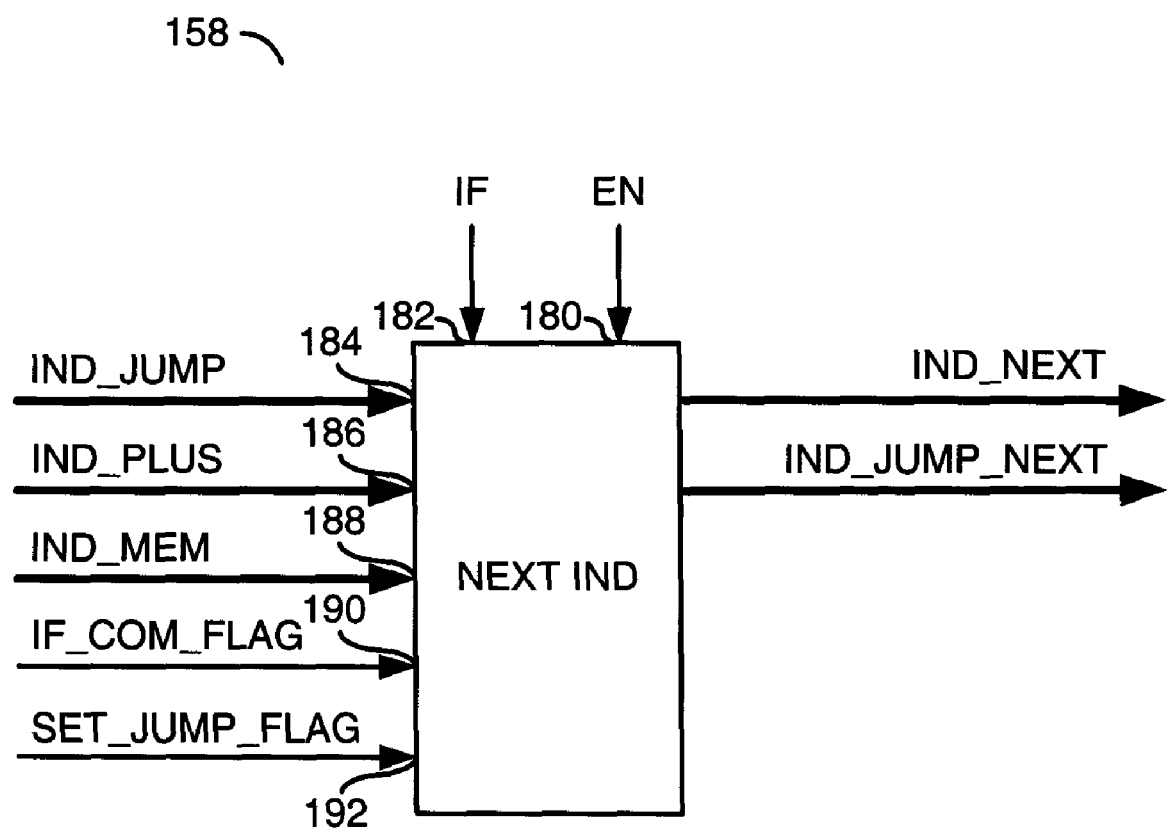
FIG. 6 is a diagram of one of the circuits of the microprocessor.

Referring to FIG. 6, a detailed diagram of the circuit 158 is shown. The circuit 158 may compute the next value of the signal IND (e.g., the memory address RA to be read next), IND NEXT, and the next value for the signal IND_JUMP, IND JUMP NEXT.

If the inputs to the circuit 158 are IND_MEM=DATA, IND_PLUS=IND+1, and IND_JUMP, then the circuit 158 computes new values for the signal IND_NEXT and the signal IND_JUMP_NEXT as follows:

1. (jump command case) if SET_JUMP_FLAG=1, then IND_JUMP_NEXT=IND_MEM; otherwise hold the current value of the signal IND_JUMP_NEXT=IND_JUMP;

2. (conditional command case) if IF=0 and IF_COM_FLAG=1 and EN=1, then IND_NEXT=IND_JUMP;

3. (unconditional command case) if (IF=0 or IF_COM_FLAG=0) and EN=1, then IND_NEXT=IND_PLUS; and 4. (reset case) if IF=0 then IND_NEXT=0.

Figure 7:
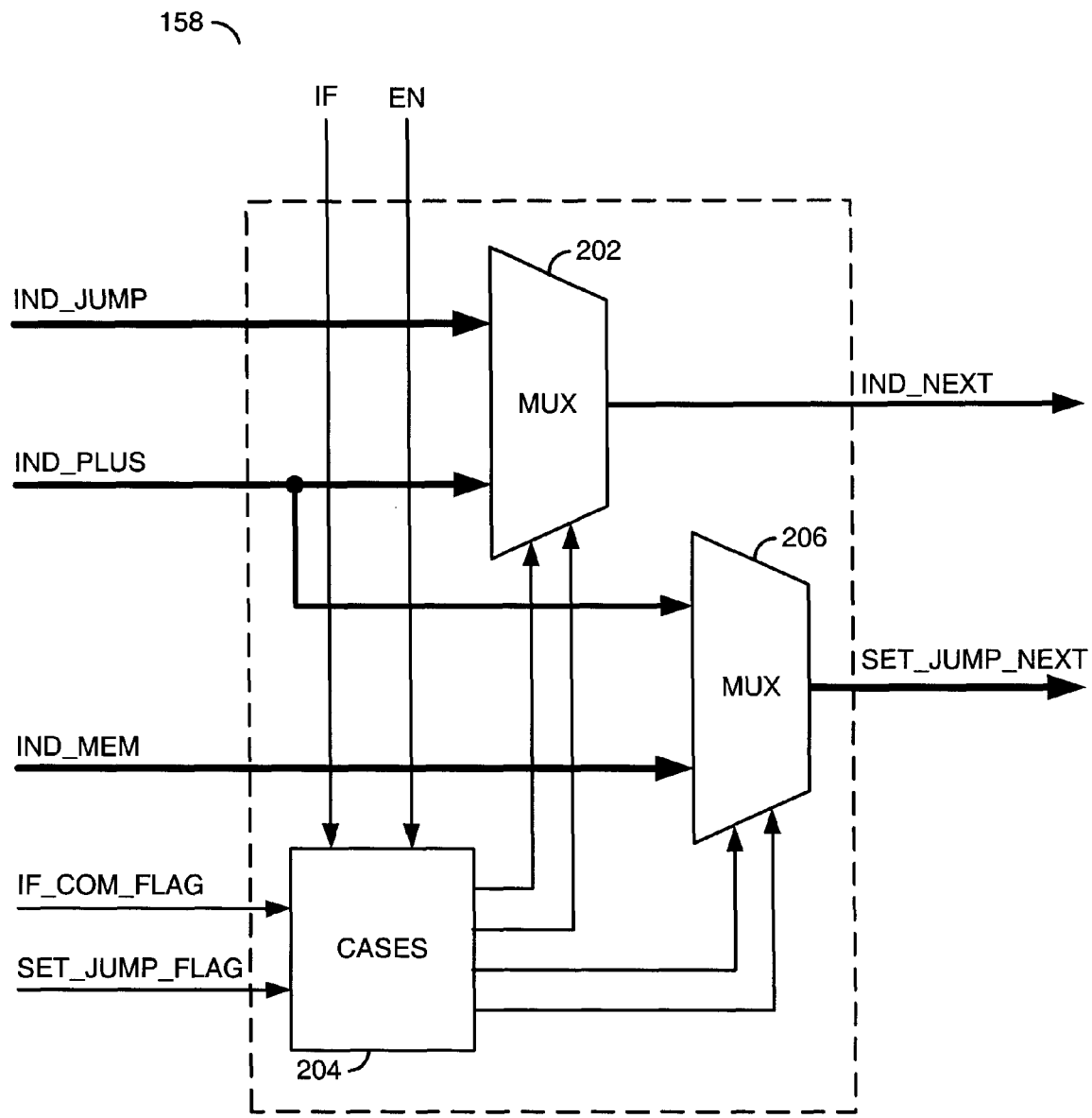
FIG. 7 is a more detailed diagram of one the circuits of the microprocessor.

Referring to FIG. 7, a more detailed diagram of the circuit 158 is shown. The circuit 158 generally comprises a circuit 202, a circuit 204, and a circuit 206. The circuit 202 may be implemented as a multiplexer. The circuit 204 may be implemented as a de-multiplexer. The circuit 206 may be implemented as a multiplexer. The circuits 202, 204 and 206 illustrate an example implementation of the logic described. Other logic may be implemented to meet the design criteria of a particular design.

Figure 8:
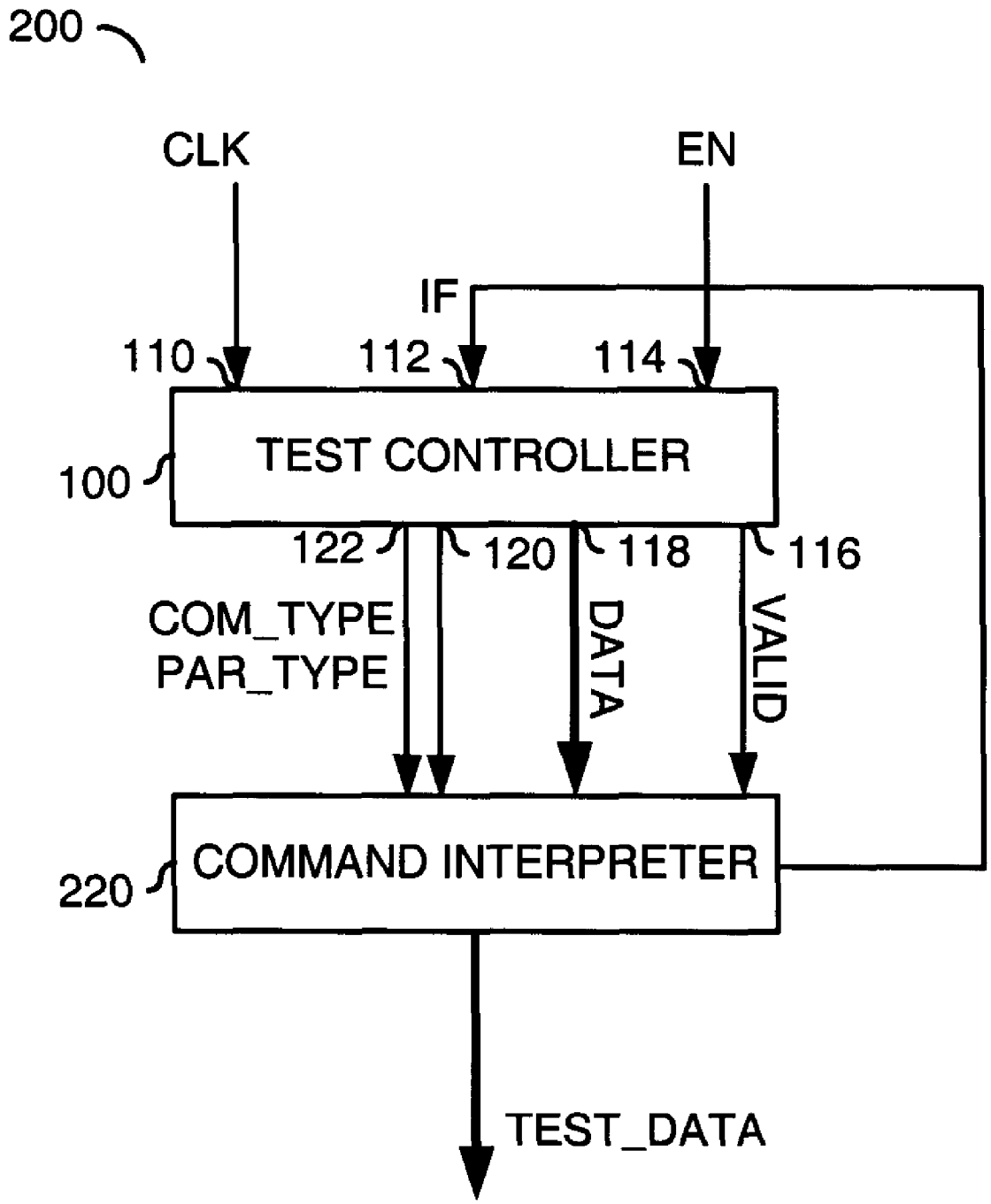
FIG. 8 is a diagram of the circuit test controller of FIG. 2 with a command interpreter.

Referring to FIG. 8, a diagram of a system 200 is shown illustrating the circuit 100 in the context of a circuit 220. The circuit 220 may be implemented as a command interpreter. The command interpreter 220 may be configured to receive the signals COM_TYPE, PAR_TYPE, DATA, and VALID. The signal DATA, generated from the test controller module 100, includes the microprocessor data and commands that may be further interpreted and decoded by the command interpreter circuit 220. Using appropriate prefix coding, the test controller 100 may present the signal DATA to be decoded by the command interpreter 220. The command interpreter 220 generates test command-data flow as the signal TEST_DATA.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a processor configured to test an external memory using a testing program, wherein said processor is configured (a) to receive (i) a data output signal comprising a data portion and a prefix portion, (ii) an enable signal, and (iii) an interface signal and (b) to generate a read address signal, present a data signal, a first control signal, a second control signal, and a third control signal in response to said data output signal, said enable signal and said interface signal; and
   an internal memory configured to receive and store said testing program, wherein said testing program is downloadable to said internal memory, said testing program can be updated during testing, and said internal memory is further configured to present said data output signal in response to the said read address signal.

2. The apparatus according to claim 1, wherein said internal memory comprises a dual port memory.

3. The apparatus according to claim 1, wherein said apparatus is included in a built-in self-test controller.

4. The apparatus according to claim 1, wherein said internal memory comprises an erasable and programmable read only memory.

5. The apparatus according to claim 1, wherein said testing program comprises a precompiled test sequence stored in a binary file.

6. The apparatus according to claim 1, wherein said test program is executable during a a testing phase in a factory.

7. The apparatus according to claim 6, wherein said testing program is updatable during said testing phase.

8. The apparatus according to claim 1, wherein said apparatus is further configured to test a plurality of memory modules connected to said apparatus by a plurality of collar circuits.

9. The apparatus according to claim 1, wherein said apparatus is used to test one or more integrated circuit designs.

10. The apparatus according to claim 1, wherein said processor comprises:
    a first circuit configured to generate said first control signal, said second control signal, a first auxiliary flag and a second auxiliary flag in response to said prefix portion of said data output signal; and
    a second circuit configured to generate a next value for said read address signal and a next value for a jump signal in response to said first auxiliary flag, said second auxiliary flag, said data portion of said data output signal, an incremented value of a current read address signal, a current value of said jump signal, said interface signal and said third control signal.

11. The apparatus according to claim 10, wherein said third control signal comprises a delayed version of said enable signal.

12. The apparatus according to claim 10, wherein said processor further comprises:
    a first flip-flop configured to store said current value of said read address signal in response to a clock signal;
    an adder configured to generate said incremented value of the current read address signal;
    a second flip-flop configured to store said current value of said jump signal in response to said clock signal; and
    a third flip-flop configured to generate said third control signal in response to said clock signal and said enable signal.

13. The apparatus according to claim 10, wherein said prefix portion of said data output signal comprises a first prefix bit and a second prefix bit, and wherein said first circuit is configured to (i) set said first auxiliary flag to 1 when said first prefix bit is 0 and said second prefix bit is 1 and (ii) set said second auxiliary flag to 1 when said first prefix bit is 1 and said second prefix bit is 0.

14. The apparatus according to claim 13, wherein said data portion of said data output signal comprises (i) an unconditional command when said first prefix bit is 0 and said second prefix bit is 0, (ii) a conditional command when said first prefix bit is 0 and said second prefix bit is 1, and (iii) a set jump command when said first prefix bit is 1 and said second prefix bit is 0.

15. The apparatus according to claim 10, wherein said second circuit comprises:
    a third circuit configured to select between said incremented value of said current read address signal and said current value of said jump signal for presentation as said next value for said read address signal in response to a fourth control signal;

a fourth circuit configured to select between said data portion of said data output signal and said incremented value of said current read address signal for presentation as said next value for said jump signal in response to a fifth control signal; and a fifth circuit configured to generate said fourth and said fifth control signals in response to said first auxiliary flag, said second auxiliary flag, said interface signal, and said enable signal.

16. The apparatus according to claim 15, wherein said third and said fourth circuits comprise multiplexers.

17. The apparatus according to claim 1, further comprising a command interpreter configured to:
    (a) receive said first control signal, said second control signal, said third control signal, and said data signal from said processor; and
    (b) present said interface signal to said processor.

18. The apparatus according to claim 17, wherein said command interpreter generates a test command-data flow for testing said external memory in response to said first control signal, said second control signal, said third control signal, and said data signal.

19. An apparatus comprising:
    means for generating a first control signal, a second control signal, a first auxiliary flag and a second auxiliary flag in response to a prefix portion of a data output signal;
    means for generating a next value for a read address signal and a next value for a jump signal in response to said first auxiliary flag, said second auxiliary flag, a data portion of said data output signal, an incremented value of a current read address signal, a current value of said jump signal, an interface signal and an enable signal; and
    means for receiving and storing a precompiled testing program, wherein said receiving and storing means is configured to present said data output signal in response to said read address signal and said testing program can be updated during testing.

20. A method of testing an external memory comprising:
(A) receiving and storing a precompiled testing program in an internal memory, wherein said precompiled testing program can be updated during testing;
(B) presenting commands of said precompiled testing program as a data output signal in response to a read address signal;
(C) generating a first control signal, a second control signal, a first auxiliary flag and a second auxiliary flag in response to a prefix portion of said data output signal;
(D) generating a next value for said read address signal and a next value for a jump signal in response to said first auxiliary flag, said second auxiliary flag, a data portion of said data output signal, an incremented value of a current read address signal, a current value of said jump signal, an interface signal and an enable signal; and
(E) testing said external memory based upon said first control signal, said second control signal, an enable signal, and said data portion of said data output signal.

\* \* \* \* \*